United States Patent [19]

Turl et al.

[11] Patent Number: 4,728,906
[45] Date of Patent: Mar. 1, 1988

[54] TUNING AND CALIBRATION CIRCUITS FOR CW AND SWEEP FREQUENCY SIGNAL GENERATORS

[75] Inventors: Christopher B. D. Turl, Letchworth; Geoffrey J. Hurst, Royston, both of England

[73] Assignee: Wiltron Measurements Limited, Stevenage, England

[21] Appl. No.: 919,191

[22] Filed: Oct. 15, 1986

[30] Foreign Application Priority Data

Oct. 21, 1985 [GB] United Kingdom ............... 8525878

[51] Int. Cl.⁴ .......................... H03L 7/12; H03L 7/20
[52] U.S. Cl. ........................................... 331/4; 331/10; 331/16; 331/19; 331/178
[58] Field of Search ................. 331/4, 14, 16, 19, 25, 331/178, 10

[56] References Cited

U.S. PATENT DOCUMENTS

| | | | |
|---|---|---|---|
| 3,931,586 | 1/1976 | Carpenter | 331/19 X |
| 4,001,714 | 1/1977 | Reed | 331/19 X |
| 4,511,858 | 4/1985 | Charavit et al. | 331/10 |
| 4,513,448 | 4/1985 | Maher | 331/19 X |
| 4,584,539 | 4/1986 | Stankey | 331/16 |

Primary Examiner—Siegfried H. Grimm
Attorney, Agent, or Firm—Lee, Smith & Zickert

[57] ABSTRACT

A signal generating device and method of control thereof for producing a desired output frequency, the generator having coarse and fine tuning controls capable of producing frequency changes over a limited range, wherein the output of the device is combined in a mixing device with a multi-component reference signal produced from an oscillatory generator circuit, a beat signal is detected by processing circuitry as the frequency controls are adjusted and the values of the frequencies of the control signals occurring on such detection are stored, and using a look-up table or algorithm the value of a correction signal is determined which, when combined with the stored values, will cause the output frequency of the device to be adjusted to the desired value via the fine tuner.

16 Claims, 8 Drawing Figures

TUNING AND CALIBRATION CIRCUITS FOR CW AND SWEEP FREQUENCY SIGNAL GENERATORS

DESCRIPTION

1. Field of Invention

This invention concerns signal generators particularly stablised signal generators capable of operating in the GHz range either in continuous wave (CW) mode or Swept frequency mode and typically used in transmission/reflection analysers.

2. Background to the Invention

Various source oscillators are available for generating very high frequency electrical signals but all suffer to a greater or lesser extent from drift introduced by environmental changes such as temperature, power supply fluctuations and variation in electrical components associated with the oscillatory source. Typical sources for very high frequency applications utilise a YIG oscillator or a Varactor tuned oscillator.

Techniques for improving frequency stability fall under two headings;

(a) techniques for unlocked sources, and
(b) techniques for locked (usually phase-locked) sources.

In the case of unlocked systems, an open loop form of correction is normally incorporated with some form of linearisation circuit. This type of approach can vary from simple diode shaping networks which are common with Varactor tuned circuits to more complex PROM data correction incorporated into microprocessor controlled signal generators. Because the circuits are open loop, no correction is possible for frequency shifts with time or mismatch errors.

By using a temperature sensing thermistor, a correction signal can be generated to assist in correcting the source frequency for temperature drift. However, in all other respects the arrangement is essentially open loop.

With locked systems, a signal is derived from the high frequency source using a Down-Conversion principle so as to obtain a signal having a lower frequency than the source, and this Down-Converted signal is compared with a Reference Signal normally derived from a crystal controlled oscillator. The comparison occurs in a phase detector the output of which is a voltage proportional to the phase error of the two signals. The correction voltage is applied to the tuning port of the high frequency source oscillator to correct for frequency shifts and by the nature of the system remarkably high levels of accuracy can be achieved.

Thus whilst open loop systems typically have an accuracy which will allow the generated signal to lie within a range of +/−5 MHz in a signal approaching 2000 MHz, closed loop phase locked systems can achieve accuracies of better than 1 KHz in 2000 MHz.

As would be expected, closed loop phase locked systems are complex and more expensive than the relatively more simple open loop unlocked systems.

Both types of source can be configured to produce either a CW output or a Swept output.

In the case of an open loop source, frequency sweeping is achieved by adjusting the frequency determining component to a start frequency and then applying an increasing (or decreasing) tuning signal (usually a varying voltage) to the tuning port of the oscillatory device. This may be achieved by generating a ramp voltage which may be derived using analogue circuits or may be derived from a digital signal using a digital to analogue converter (DAC). Where the latter approach is used a microprocessor is conventionally employed to control the generation of the ramp voltage. Whatever type of ramp signal is used (either analogue or digitally derived) the oscillator has a varying level of frequency inaccuracy due largely to the non-linearity of the tuning port of the oscillator and temperature changes.

In the case of a phase-locked system, two approaches are possible.

In one arrangement the start frequency at the beginning of each sweep is phase-locked, using a phase detector, to relate the required output frequency to a reference frequency. The source is ramped in an open loop manner, the swept range being achieved in the same way as in a normal open loop case. However the accuracy is greater in that the frequency at the start of each sweep is phase-locked.

Alternatively not only the start frequency is phase-locked but a fully synthesized sweep is produced by digitally moving up (or down) in frequency by a series of steps and phase locking to each frequency step and only moving onto the next frequency step after phase locking has been achieved.

Of these two arrangements, the first offers a fast sweep update time but relatively poor frequency accuracy across the swept band whilst the second offers a much higher level of frequency accuracy during each sweep, but a slower sweep update time.

With either of the phase locked versions, any frequency drift due to time, temperature or output mismatch will be corrected-for, either instantly, or at least before each sweep. No such correction is possible within an open loop swept frequency generator.

Because of the very considerable cost of phase locked systems, various attempts have been made to improve the accuracy of open loop systems. One approach has been to generate so-called "BIRDI markers" and provide a visual display associated with the signal generator, on which the electrically generated marker signals can be displayed.

Such systems operate by producing from a crystal controlled signal, a so-called "comb" (or harmonic series) of frequencies each of which is a multiple of the frequency of the original crystal controlled signal. The generator output signal is sampled, and the sample signal is mixed with the "comb" signal. A beat or "BIRDI" is produced between components of the "comb" signal which are closest in frequency to the frequency of the output signal. Using low pass filters, the beat (or "BIRDI") signal can be separated from the higher frequency signals and can be amplified and displayed on a CRT or similar display device. Frequency correction is achieved by the user manually adjusting the master oscillator to correct for any frequency drift which will be seen as a shift of the "BIRDI" display on the screen.

Whilst a system utilising such a display has the configuration of a closed loop (when the user is considered) the accuracy achievable is far less than that of a phase-locked loop system and apart from the time delay inherent in such systems, they possess other disadvantages relative to conventional open loop systems namely:

(a) If the amplitude of the output signal is reduced, the beat signal is also reduced in amplitude and eventually can become lost within the electrical noise within the system. At this stage visual correction becomes very difficult.

(b) If a very frequency selective component is tested having a very steep response curve, the beat signal can be lost in the steep component characteristic making frequency correction again very difficult.

On the other hand the generation of a beat signal from a crystal controlled source represents a simple method of generating a feedback signal and it is an object of the present invention to provide a closed loop system which is simpler and cheaper than a conventional phase-locked loop system and which derives the feedback information for frequency control from a beat signal.

SUMMARY OF THE INVENTION

According to the broadest aspect of the present invention in a method of setting up a signal generator to deliver an output frequency of F MHz which may lie anywhere in a range extending up to hundreds and thousands of MHz, and which includes coarse and fine frequency controlling elements, wherein the latter is capable of producing linear changes in output frequency for corresponding changes in the parameter of an electric signal supplied thereto, but only over a small range of N MHz:

the output of the device is combined with a multi-component reference signal containing at least a component having a frequency of L MHz. which is within N MHz of the desired frequency F MHz, the frequency controlling signals supplied to the device are adjusted to yield an output signal having a frequency also within N MHz of F MHz;

the fine frequency controlling element is then adjusted until a beat signal is detected, (at which point the device can be calibrated since the beat signal indicates a one to one relationship of the output signal and the reference signal (or a component thereof), the values of the frequency controlling signals at which a beat signal is detected are stored, using an algorithm or look-up table the value of a correction signal required by the fine frequency controlling element to shift the frequency of the device by (F−L) MHz is determined and the desired output signal of F MHz is obtained by adding the correction signal to the stored signals and using the combined signal as the control signal for the device.

Typically the calibration procedure and the frequency shifting, null point detection, signal storage and addition is under the control of a microprocessor.

According to another aspect of the present invention a signal generator whose output frequency is to be set at a frequency F, comprises:

(1) a master oscillator having an output at which a radio frequency signal appears when the oscillator is operating and having in addition to a large bandwidth frequency controlling element, a small bandwidth control element by which changes in the frequency of oscillation over the small band of frequencies can be obtained by making linear changes in a parameter of an electrical signal supplied thereto, (2) a control system adapted to generate from information entered therein, electrical signals for controlling the frequency of the master oscillator, (3) means for deriving a sample signal from the output of the master oscillator;

(4) a stable fixed frequency oscillatory signal source for producing a reference signal, F(ref);

(5) circuit means for producing from the reference signal F(ref) a harmonic spectrum or "comb" of signals F(ref); 2F(ref); 3F(ref) . . . n.F(ref)−(referred to as a harmonic spectrum signal), at least one component of which is within the said small band of frequencies from F;

(6) mixing or sampling circuit means for combining the sampled signal with the harmonic spectrum signal to produce beat signals, i.e. signals having frequencies which are inter alia the arithmetic difference between the frequency of the sample signal and the component in the said harmonic spectrum signal; and (7) beat signal detector circuit means responsive to the output of the mixing circuit means and adapted to identify when a beat signal pulse is occurring:

wherein for the purpose of frequency calibration the control circuit is programmed to alter the frequency determining signals supplied to the master oscillator until a beat signal is detected (caused by the interaction of the master oscillator output signal and a component N.F(ref) of the harmonic spectrum signal) at which point the values of the frequency determining signals supplied to the master oscillator are employed in the computation of new values for the control signals for the master oscillator to give a frequency of oscillation equal to (N.F(ref)+X). (Where X is the frequency shift required beween N.F(ref) and the desired frequency F).

The beat signal of interest may be selected from the large number of sum and difference signals by separation on a frequency selective basis using a low pass filter.

Typically the crystal controlled oscillator is set to operate at a frequency of the order of 25 MHz if the master oscillator is to ooerate at frequencies in the range 1 MHz upwards.

According to another aspect of the invention a method of controlling the frequency of oscillation of a master oscillator in a signal generator in which the linear frequency controlling element has a restricted frequency sweep capability comprises the steps of:

1. generating frequency control signals which will theoretically produce a frequency F in the output of the master oscillator, 2. combining a sample of the master oscillator output signal with a reference signal having a component in the said restricted frequency sweep of the master oscillator;

3. adjusting the values of the frequency control signals until a beat signal is detected between the master oscillator output signal and the reference signal component; and 4. thereafter adjusting the values of the frequency control signals from the values corresponding to the calibration, to new values computed using an algorithm or look-up table describing the frequency response of the master oscillator to the values of the frequency control signals therefor, so as to shift the master oscillator output to a desired frequency.

It will be seen that after the calibration procedure has been effected, the frequency of the master oscillator will be correct and thereafter remain so depending on the quality of any open loop correction incorporated into the signal generator such as to compensate for thermal drift and the like.

When the master oscillator is called upon to sweep through a range of frequencies, the method according to the invention preferably includes the steps of:

(1) varying the computed control signal using the corrected control signal as a starting point, the variation being in accordance with an algorithm linking the frequency of oscillation with value of the control signal, (2) when the final target frequency of the sweep has been reached, thereafter inhibiting the output of the signal generator, and (3) thereafter repeating the correction process involving the aforementioned method until a beat signal is detected once again whereafter the sweep process can again be initiated.

The reference signal may be a so-called harmonic spectrum signal typically derived from a crystal controlled source by means of a step recovery diode or the like.

It will be seen that with this form of correction, the linearity of the sweep frequency will be dictated inter alia by the accuracy of the algorithm linking the oscillator frequency to the control signals therefor.

If the algorithm is an imperfect description of the frequency versus control signal relationship or if the particular master oscillator is relatively non-linear and the algorithm is a theoretical description of the performance of a more linear version of such a device, then the resulting sweep will not be particularly linear.

Unless sweep time does not permit, a preferred method according to the invention involves the steps of:

(1) identifying a series of key frequencies throughout the range which is to be swept and starting with either the lowest or the highest, making corrections to the control signal supplied to the master oscillator until a beat signal is produced by the interaction of the master oscillator output signal and a component of the reference signal, (2) modifying the corrected control signal in accordance with the known algorithm to produce a control signal for obtaining frequencies in between the first frequency and the next target frequency, (3) when the next target frequency is approached, repeating the calibration process for the oscillator control signal before continuing to alter the frequency of the oscillator through the next range of frequencies to the next target frequency.

In this way the frequency of the master oscillator is corrected at each of a series of steps throughout the range and if high accuracy is required, a correspondingly large number of steps may be employed.

Typically digital signals are generated by the microprocessor and digital to analogue converters (DAC's) serve to convert the digital signals to voltages or currents which can be used to control the frequency of the master oscillator.

Selection of the appropriate beat signal is most conviently achieved using a low pass filter set to transmit signals in the range d.c. to f (where f may for example lie in the range of 500 KHz to 5 MHz).

In view of the attenuation effect of a low pass filter, signal amplifying and pulse conditioning circuit means is preferably provided after the low pass filter and before the microprocessor.

Typically the high accuracy fixed frequency oscillatory source is a crystal controlled oscillator.

High levels of accuracy are achievable by determining from the width of the beat signal pulse the precise mid-position of the selected beat signal pulse, which corresponds to the null frequency or DC content within the beat signal. Thus the microprocessor is preferably programed to seek out the mid-position of any beat signal pulse detected thereby and to use the determined mid-position of the pulse as the target.

Where the stored information is in digital form and alteration to this information is in the form of a digital error signal which is produced by the microprocessor, both the stored information and the error signal can be converted to analogue signals to enable them to be summed more easily than would otherwise be the case.

In a Sweep mode, i.e. where the generator produces a signal whose frequency varies with time from a first frequency (f1) to a second frequency (f2) defining a Swept Band, conveniently two items of information are entered into a memory associated with the miroprocessor namely;

1. the Sweep Width (i.e. F2−F1), and
2. the Centre of the Swept Range (i.e. ½(F2+F1)).

The process of finding the start of the Swept Range involves the steps of:

1. from the Sweep Width and the Centre information a microprocessor is programmed to compute a control signal so that digital to analogue converter means initialised by the microprocessor produces one or more analogue signals which should theoretically cause the master oscillator to generate the start frequency 2. simultaneously an error DAC (whose output is combined with the first mentioned DAC means) is set to mid-range;

3. a correction in the error signal is then produced by the microprocessor so as to alter the output from the error DAC until a beat or difference signal is detected.

4. the total correction to the value of the error signal required to produce a beat signal pulse is stored in a buffer memory for subsequent reference.

5. an adjustment in the control signals supplied to the master oscillator is effected according to the frequency/control signal characteristic of the master oscillator, using the stored values in the buffer as a starting point, to obtain a new frequency of operation of the master oscillator corresponding to the Start frequency (f1) of the Sweep.

6. a Sweep is effected by the microprocessor producing a varying output signal which is applied to the frequency controlling element of the master oscillator so as to produce the desired sweep in the output frequency thereof from f1 to f2.

At the end of each Sweep, the microprocessor reverts to a search routine to locate the beat signal to recalibrate the oscillator, so that the latter is corrected at the beginning of each Sweep.

Preferably the master oscillator includes two frequency controlling elements, a first one for effecting large changes in frequency and a second for effecting smaller changes in frequency, each having an input, and the control device such as a microprocessor driven controller is adapted to produce a first control signal for the first input and a second control signal for the second input. Where an error signal is generated by the control device, this may be added to or subtracted from the value of the said second control signal.

For high frequency applications the master oscillator is preferably a YIG oscillator having a main tuning coil for wide range tuning and a smaller FM coil for fine range tuning.

Alternatively a Varactor tuned oscillator may be employed.

DESCRIPTION OF THE DRAWINGS

The invention will now be described by way of example with reference to the accompanying drawings in which:

FIG. 1 does not illustrate an embodiment of the present invention but indicates how temperature correction can be applied to an oscillator. It is anticipated that correction of this nature could be included in embodiments of the present invention.

Figure 1:
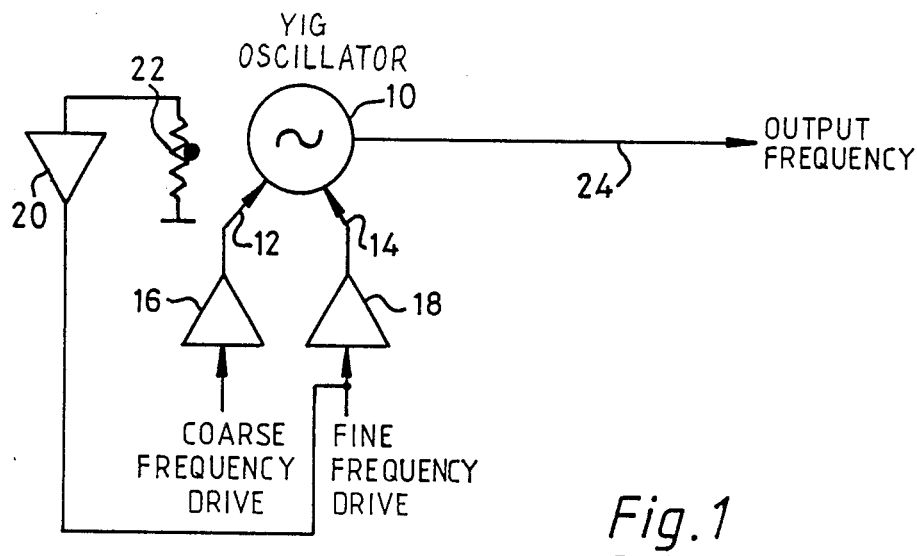
FIG. 1 illustrates diagrammatically an open loop oscillator with temperature correction.

Thus in FIG. 1 a YIG oscillator 10 has a coarse tuning port 12 associated with the main tuning coil and a fine tuning port 14 associated with the FM coil. Signal amplifiers 16 and 18 serve to supply control signals to ports 12 and 14 respectively. Coarse frequency adjustment typically in the form of a potentiometer is not shown but the fine frequency drive input is shown as having been derived from an amplifier 20 the input of which includes a temperature correction resistor or thermistor 22. By positioning the latter to sense changes in temperature of oscillator 10, so a compensating error signal can be fed back via amplifiers 20 and 18 to the input 14 to correct for temperature drift.

The output frequency on line 24 will thus be better stablised than without the temperature correction.

Figure 2:
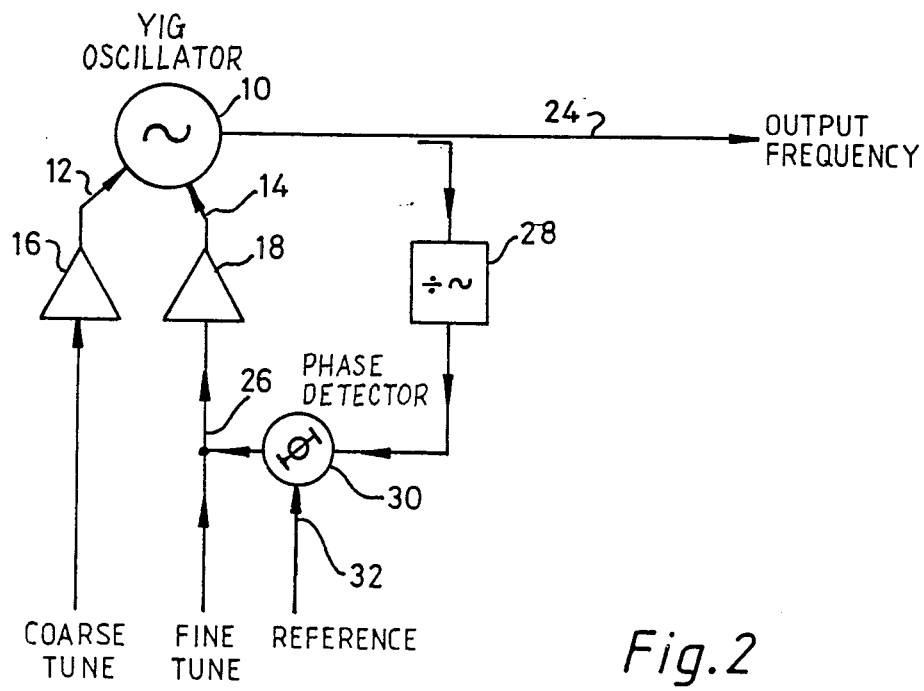
FIG. 2 illustrates a closed loop oscillator or synthesizer.

FIG. 2 illustrates a more complex, closed loop phase locked oscillator. Similar reference numerals have been used to denote parts in common with FIG. 1.

The primary difference between the two circuits is that a closed loop is formed between the output 24 and the fine frequency drive amplifier 18 input at 26. The loop is closed by means of a programmable divider 28 feeding a low frequency signal to a phase detector 30 to which a reference signal is supplied at 32 typically from a crystal controlled oscillator.

Any minute change in frequency between the sub-multiple of the output frequency on line 24 and the crystal controlled frequency on input 32 will be seen as a phase difference, and an error signal generated by the phase detector is supplied to the fine tuning port 14 via amplifier 18. Very high levels of accuracy can be attained using this type of circuit.

The complexities and cost however of such circuits particularly at very high frequencies means that there is a place for an alternative approach in accordance with the present invention.

Figure 3:
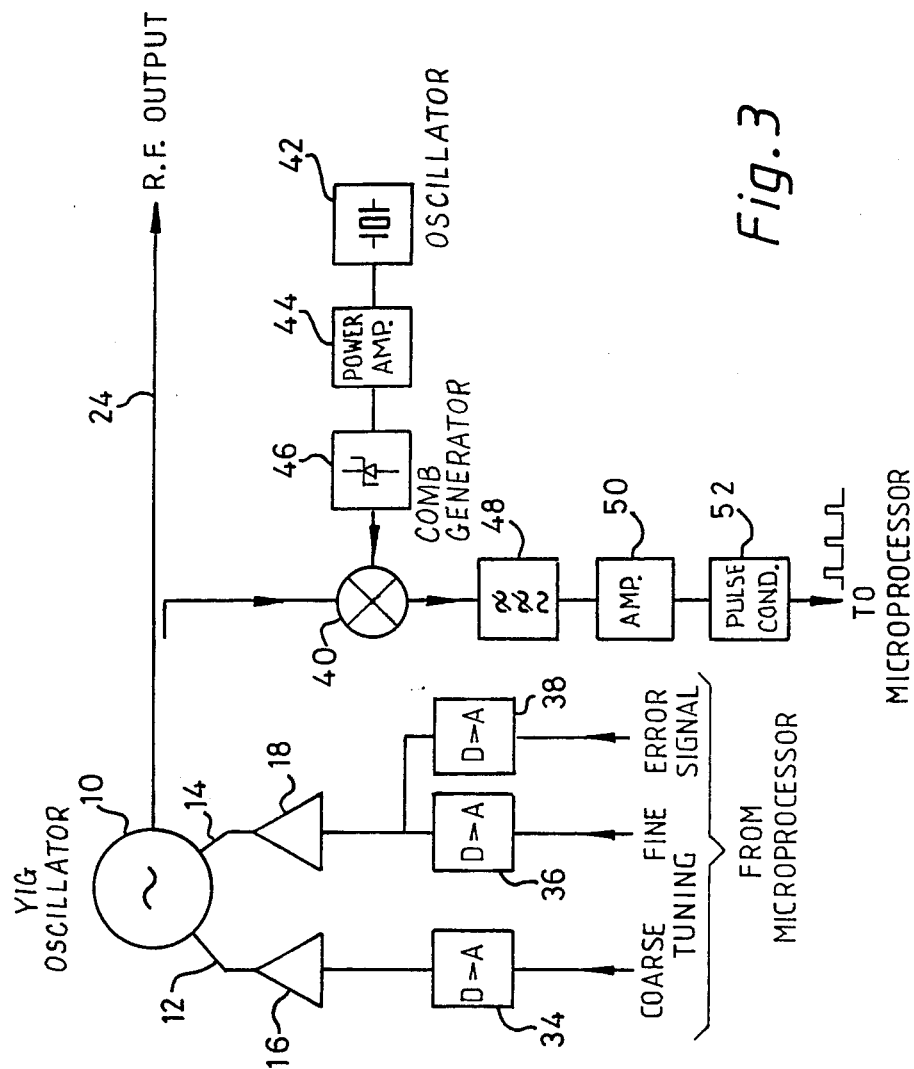
FIG. 3 is a block circuit diagram of a crystal controlled beat signal (marker) generating circuit for frequency calibration of a master oscillator embodying the present invention.

FIG. 3 is a block circuit diagram of an embodiment of the present invention. As before common parts have been identified by reference numerals already used in FIGS. 1 and 2.

The invention is primarily directed to very high frequency signal generators (although it is not limited to such applications) and in particular to signal generators for generating signals in the range 1 MHz to 2000 MHz.

In accordance with the invention digital signals from a microprocessor (not shown) are supplied via DAC 34 to amplifier 16 and via DAC 36 to the input of amplifier 18. DAC 38 supplies an error signal in combination with the output of DAC 36.

The sampled signal from line 24 is applied as one input to a mixer or sampler 40 the other input of which comprises a signal derived from a crystal controlled oscillator 42, operating typically at 25 MHz, the output of which is amplified in a power amplifier 44 and is then applied via a step recovery diode 46 to produce a so-called "comb" signal or harmonic spectrum signal, in which the lowest frequency is 25 MHz and the highest is dictated inter alia by the bandwidth of the circuitry.

The conversion of the 25 MHz fixed frequency signal into the harmonic spectrum signal ensures a large number of so-called "BIRDI" markers are generated, with which the sample signal can be compared.

The comparison is effected by a mixing technique which results in sum and difference signals in the output of the mixer device 40. A low pass filter 48 eliminates all but the most useful beat signal pulses and to this end is a low pass filter having a 1 MHz cut-off. The attenuated output is amplified by amplifier 50 and supplied via pulse conditioning circuit 52 to a microprocessor.

Figure 4A:
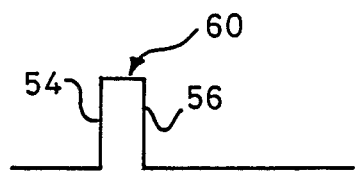
FIGS. 4a and 4b illustrate a typical marker pulse structure.
Figure 4B:
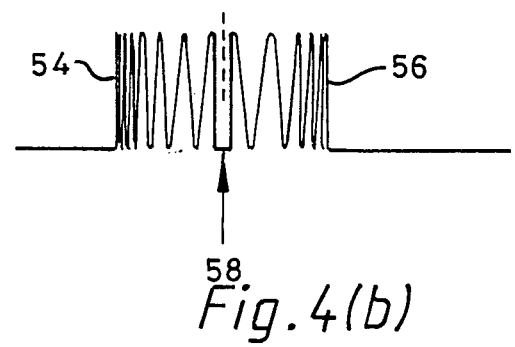

Reference to FIGS. 4a and 4b will better indicate the nature of the pulses in the output of conditioner 52.

At FIG. 4a can be seen the output pulses from the low pass filter, to a small scale, which is generated whenever the oscillaator frequency passes through a harmonic component of the 25 MHz reference signal each such pulse is itself made up of a number of pulses (see FIG. 4b) the repetition frequency of which varies from a relatively high level near the edges of the pulse to a d.c. level (in theory) in the middle of the pulse. Edge regions are denoted by reference numerals 54 and 56 in FIGS. 4a and 4b and the central d.c. zone is denoted by reference numeral 58.

Since the pulses such as 60 as shown in FIG. 4a, are relatively narrow, to a first approximation the leading edge (or the trailing edge) of each said pulse can be detected and used to denote the arrival of a beat signal.

According to a preferred aspect of the invention, apparatus is provided for determining the mid-point of each such pulse 60 so that the true DC or null frequency zone is used to determine the actual presence of the pulse.

Figure 5:
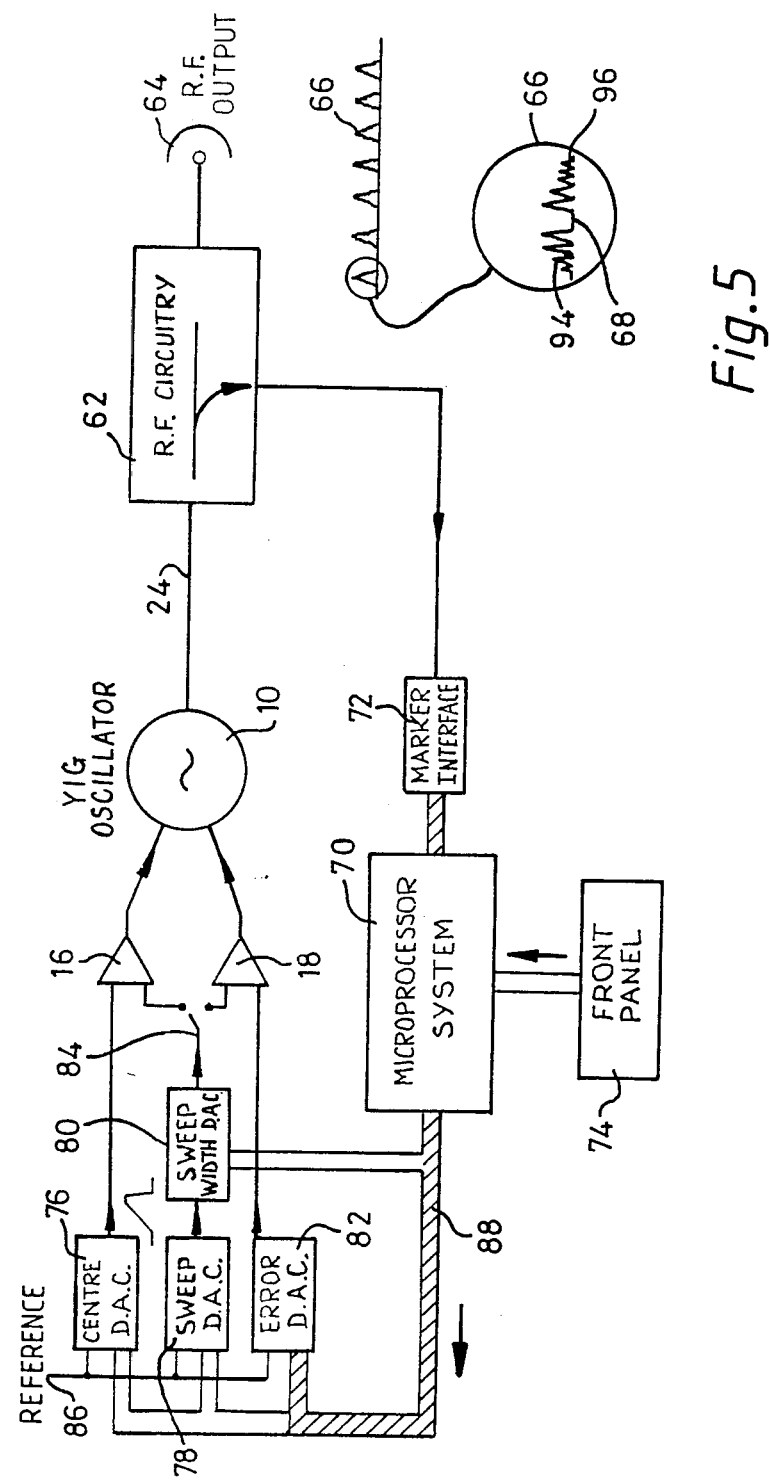
FIG. 5 is a block circuit diagram of an RF source with drive circuitry and beat signal (marker) locking loop, embodying the invention.

FIG. 5 illustrates a development of the system shown in FIG. 3 and includes in a general sense a microprocessor control system not previously shown.

Where components are commmon to the preceding Figures, the same reference numerals have been employed. Thus a YIG oscillator 10 provides an RF output along line 24 and the content of the elements 40, 42, 44, 46, 48, 50 and 52 are for convenience shown as a single element in FIG. 5 identified by reference numeral 62. One output from this element comprises the RF output socket 64 and the other output comprises the so-called marker output at which electrical pulses comprising the beat signal pulses or markers are produced by the interaction of the output from the YIG oscillator and the harmonics derived from the output from the local crystal controlled oscillator 42 of FIG. 3.

The individual pulses are referred to as markers and in the insert within FIG. 5 is shown a plurality of such marker pulses 66 and an enlarged view of the first one. It will be seen from the enlargement that this is made up of a plurality of individual pulses of varying amplitude and frequency including a central region having essentially zero frequency, i.e. DC, denoted by reference numeral 68.

By virtue of the manner in which the pulses such as 66 are generated, the presence of the DC level within the pulse 66 indicates a particular relationship between the output of the YIG oscillator and the output of the crystal controlled oscillator 42 and is also indicative of the values of the control signals which are for the time being supplied to the YIG oscillator.

The determination of the existence of a null frequency zone or DC level within the pulses such as 66 is most simply achieved using a microprocessor controlled pulse analysing circuit generally designated 70 and a marker pulse interface unit 72 (part of which is incorporated in the pulse conditioning circuit 52 of FIG. 3), is required between the output from the mixer and low pulse filter of the circuitry contained within item 62 and the input to the microprocessor control system 70.

The latter determines the width of the first marker pulse 66 and the half-way point which corresponds to the point at which there is a one to one relationship between the YIG oscillator frequency and the frequency of the crystal controlled oscillator 42 of FIG. 3. The microprocessor control system includes a keyboard or other data input device such as 74 and the latter may be dedicated to the instrument so as to include dedicated controls such as Start/Stop and Centre/Width keys.

The signal generator of FIG. 5 is normally used in a Sweep mode of operation and in relation to much of the further description of the operation of the circuit, it will be assumed that this is the mode of operation which has been selected.

Initial presetting of the Sweep Width (scaling) and Centre is determined by the required Start and Stop frequencies that the source is to sweep over. The YIG oscillator 10 has thus to be driven between a Start and Stop frequency by controlling the electric signals supplied to two different frequency controlling elements within the oscillator as described in relation to FIG. 3. However, in order to give a greater control over the setting up of the sweep, three Digital to Analogue converters are provided in place of the two described with reference to FIG. 3. Thus a first DAC 76 determines the Centre of the sweep, a second DAC 78 produces a ramp voltage which must be supplied to one or other of the drive amplifiers 16 and 18 via a scaling DAC 80 and a third DAC 82 provides error signal conversion as an input to the second driver amplifier 18 for correcting for drift and controlling the tuning of the source.

A selector switch 84 enables the output from the scaling DAC 80 to be supplied as an input to either amplifier 16 or amplifier 18.

A common source 86 provides the reference signals for the three DACs 76, 78 and 82 and the Data BUS from the microprocessor driven control system 70 is supplied as a main data input to each of the DACs.

The data highway 88 supplies information relating to the tuning of the YIG oscillator 10 and also the Sweep parameters such as Start and Stop frequencies, and the Sweep Width information for DAC 80, Sweep DAC 78 and Centre DAC 76.

During each sweep, the sweep DAC is the only converter that needs to be altered dynamically. Information supplied via data highway 88 and 92 causes 78 to produce a fixed ramp signal the actual shape and amplitude of which is determined by parameters within the microprocessor. The actual amplitude of the ramp signal is then scaled by the converter 80 again using information from the microprocessor 70 to cover the appropriate sweep width dictated by information supplied via the data input keyboard 74.

The function of the Error DAC is to "nudge" the frequency produced by the YIG oscillator 10 by up to $+/-25$ MHz under the control of the microprocessor. This is used to shift the frequency of the signal produced by the YIG oscillator 10 until it becomes a whole number multiple of one of the harmonic components of the comb signal from circuit element 46.

The response of the Error DAC must be calibrated, stable and fast so that the frequency of the YIG oscillator can be rapidly altered with precision anywhere within the range of the 50 MHz governed by the nudge facility. In this way, as long as a beat signal can be located at some point within the 50 MHz band, the YIG oscillator can be calibrated to a frequency within $+/-25$ MHz of the desired final frequency thereby enabling the YIG oscillator to be shifted subsequently to the desired frequency by the application of an additional "error" signal, via DAC 82, to the frequency controlling signals already supplied to the oscillator during calibration.

The nudging action of the microprocessor and Error DAC 82 thus serves two purposes:

During calibration of the YIG oscillator at the beginning of each sweep, the nudge facility enables the YIG oscillator frequency to be shifted quickly and accurately throughout a 50 MHz band in order to find at least one (and preferably two) beat signals (normally referred to as markers), and after calibration, the same two components (ie microprocessor 70 and Error DAC 82) serve to generate the DC shift signal required to shift the frequency of the YIG oscillator to the desired frequency called for by the input information fed to the microprocessor.

The process of locating a beat signal or marker pulse such as 66 involves the following:

1. From the selection of a frequency span, the Centre, Sweep Width and Sweep DACs are all initialised and the Error DAC 82 is adjusted to mid-range under the control of the microprocessor 70.

2. As the sweep is about to commence, a search routine is instigated by the microprocessor in which the Error DAC 82 is adjusted first in one direction (typically down) until a marker pulse 66 is detected by the marker interface 72.

Typically this is set to look for a change in amplitude with a transition from high frequency content through to DC and back to high frequency content in the amplitude excursion concerned. The position of the null point or DC level within the detected pulse 66 is noted and the value of the error signal or nudge required to produce that particular beat signal is stored in the microprocessor memory.

3. Having established the signal required on the FM coil of the YIG oscillator to produce the marker pulse, the oscillator has effectively been calibrated. It is now a simple matter for the microprocessor to compute the additional signal to be added to (or subtracted from) the signal known to produce the same frequency as the identified comb signal component, in order to achieve the desired frequency.

Where it happens that the desired frequency is that of the marker (comb signal component), no addition or subtraction is required.

In the more general case where the desired Start frequency is not equal to one of the comb components, an algorithm or a look-up table is employed to determine the signal correction required to achieve the desired frequency from the calibration frequency.

The algorithm or look-up table may be stored in the microprocessor memory (or in a ROM or entered into the machine memory via a keyboard), and describes the frequency response of the YIG oscillator 10 for different signals supplied to the main and subsidiary frequency determining coils.

Where very high accuracy is required, the microprocessor search routine includes steps necessary to identify the high frequency edge regions of the identified marker pulse 66 identified in FIG. 5 by 94 and 96, and the microprocessor is further programmed to interpolate between these two edges of the marker pulse so as to find the mid position between the two edges 94 and 96. Since the pulse 66 is produced as the YIG oscillator frequency moves from above to below one of the comb frequencies (or in the reverse direction) the mid point 68 corresponds to when the frequency of the YIG oscillator 10 is precisely equal to the comb frequency with which it is being mixed. By incorporating this additional computation process in the microprocessor search programme, so a unique and precise signal paramter can be dictated by the processor 70 for the output from the Error DAC 82 so as to produce from the YIG oscillator 10 a signal having exactly the same frequency as that of the comb component derived from the crystal controlled oscillator 42.

Currently open loop signal generators attain frequency accuracies of the order of ±5 MHz. Apparatus embodying the invention has achieved accuracies of ±100 KHz in 2000 MHz. If the YIG oscillator 10 has good linearity and predictable frequency response for changes in control signals from 16 and 18, a very precise sweep can be obtained using such a system as shown in FIG. 5.

If CW operation is required, the Sweep Width is set to zero and the frequency of operation of the YIG oscillator 10 is determined by the Centre DAC 76. By setting the Error DAC 82 to mid range and then instigating the microprocessor search routine, the YIG oscillator 10 is calibrated by finding the nearest marker pulse such as 66 (and the mid position of that if that level of accuracy is required) and then computing the necessary error signal or nudge signal, required to shift the actual frequency of the YIG oscillator 10 to the desired frequency which the source 10 is to produce.

Drift particularly due to thermal considerations during CW operation may be controlled by a thermal compensation circuit such as described in relation to FIG. 1.

If the CW operation can be interrupted at regular intervals, the microprocessor 70 is conveniently programmed to do this and perform a further search and calibration routine during each dead interval before switching the RF back on again.

To reduce transients and switching problems, the YIG oscillator 10 is preferably not turned on and off but the RF circuitry 62 includes a suitable attenuator for attenuating the output signal during the initial calibrating and subsequent calibrating intervals.

Such an attenuator is also preferably incorporated into a Sweep Mode of operation so as to attenuate the RF signal during the calibration at the beginning of each sweep.

Figure 6:
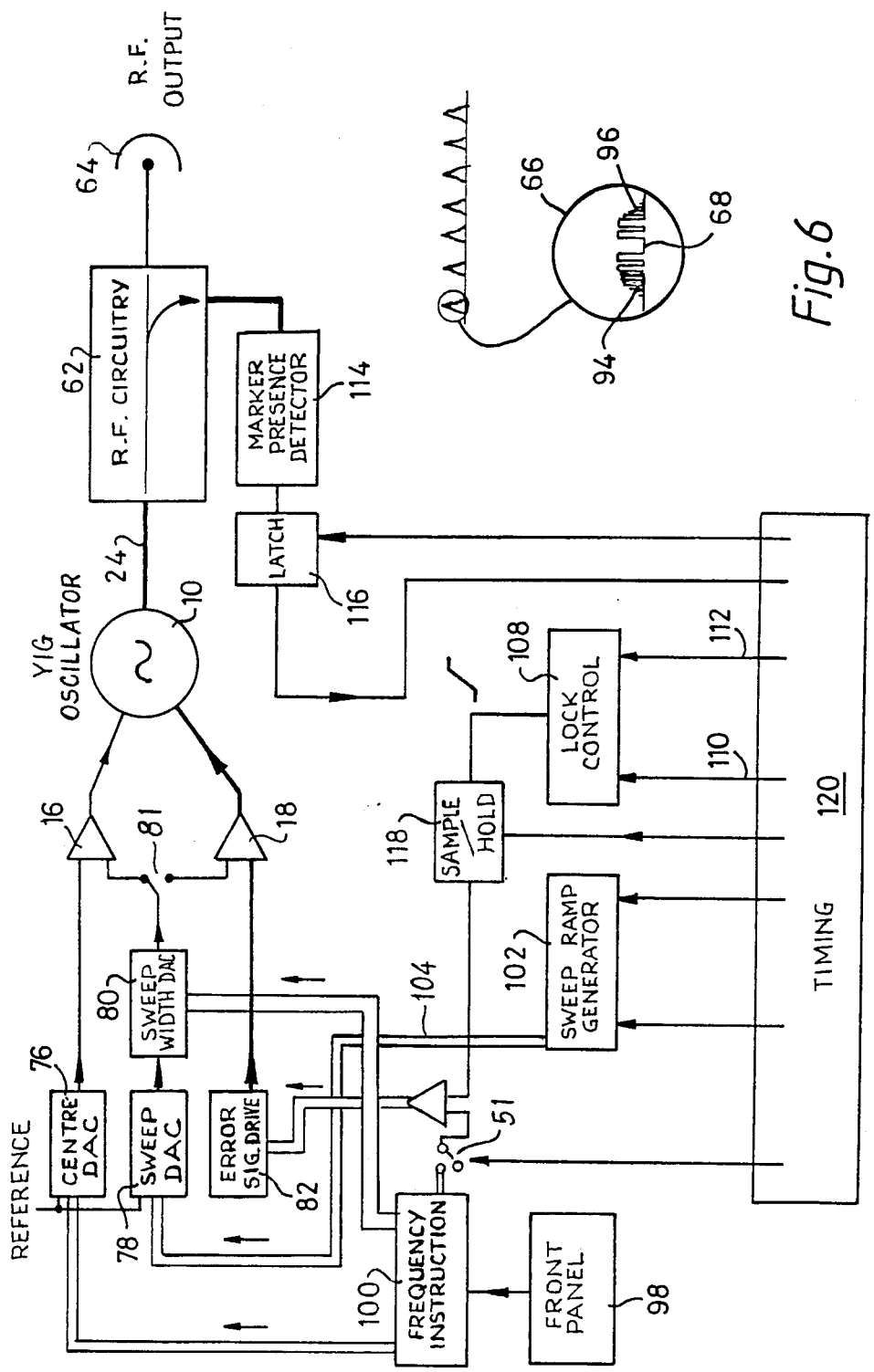
FIG. 6 is a schematic diagram of an alternative system embodying the invention but without a programmed microprocessor as required in FIG. 5.

FIG. 6 shows a hardware implementation not incorporating a microprocessor but which is limited to the accuracy associated with merely detecting the presence of a marker pulse such as 66.

Here the marker interface comprises a pulse presence detector 114 which by any convenient means detects either the leading or trailing edge of a pulse such as shown at 66.

Frequencies corresponding to the required sweep are entered via front panel 98 and a FREQUENCY INSTRUCTION circuit 100 calculates the appropriate drive signals to set up the sweep-digital data for the driving DAC's 76 etc, or analog voltages for the drive amplifiers 16, 18. It also generates a voltage corresponding to the distance the required START frequency is away from a calibration point. This is referred to as the NUDGE SIGNAL and can be switched in or out with the switch 81. Thus if the required START is 57 MHz and a calibration point is available at 50 MHz then a signal corresponding to +7 MHz is generated. If 42 MHz is the required START point, then a signal corresponding to −8 MHz must be generated. A NULL signal (0 volts) is generated for a start frequency equalling a calibration point. This will apply where the start frequency is a multiple of 25 MHz.

The FREQUENCY INSTRUCTION circuit 100 thus sets up the drive circuits such that the START frequency is a multiple of the calibration points, and after calibration, the required START frequency is achieved by switching in the NUDGE SIGNAL and adding it to the signals set up by 100.

A SWEEP RAMP GENERATOR 102 provides a fixed ramp which drives the oscillator 10 via the drive electronics 78, 80 over the requested range. This generator starts the ramp in response to a signal on the TRIGGER input. When the ramp has finished 102 indicates this by providing a signal at the SWEEP END output 104.

A further section of hardware, LOCK CONTROL 108, provides a secondary ramp covering a small frequency range sufficient to cover the maximum errors expected. When requested by a signal at the START LOCK RAMP input 110, a ramp is started from its minimum point, and stopped when demanded by the STOP LOCK RAMP input 112.

The RF output is supplied to the MARKER PRESENCE DETECTOR 114 (already referred to) whose output is latched by a latch circuit 116. LOCK CONTROL 108 operates so that in the presence of a marker pulse 66 (corresponding to a calibration point) a STOP LOCK RAMP signal is generated for input 112 and the ramp value from 108 is held in a SAMPLE & HOLD circuit 118.

The sequence of events during a typical sweep under the control of the signals from the timing circuit 120 is as follows:

(a) The frequency parameters are entered via controls on the front panel 98. The frequency instruction circuit 100 enables entry of the desired stop frequency.

It will be appreciated that the nudge signal must be removed whilst the YIG oscillator 10 is being calibrated at the beginning and ending of each sweep. It is for this reason that switch S1 is provided.

If higher accuracy is required, the detector 114 can be a more complex device to interpolate from the width of the pulse 66 and generate information corresponding to the null point 68 of the detected marker pulse as described with reference to FIG. 5.

Figure 7:
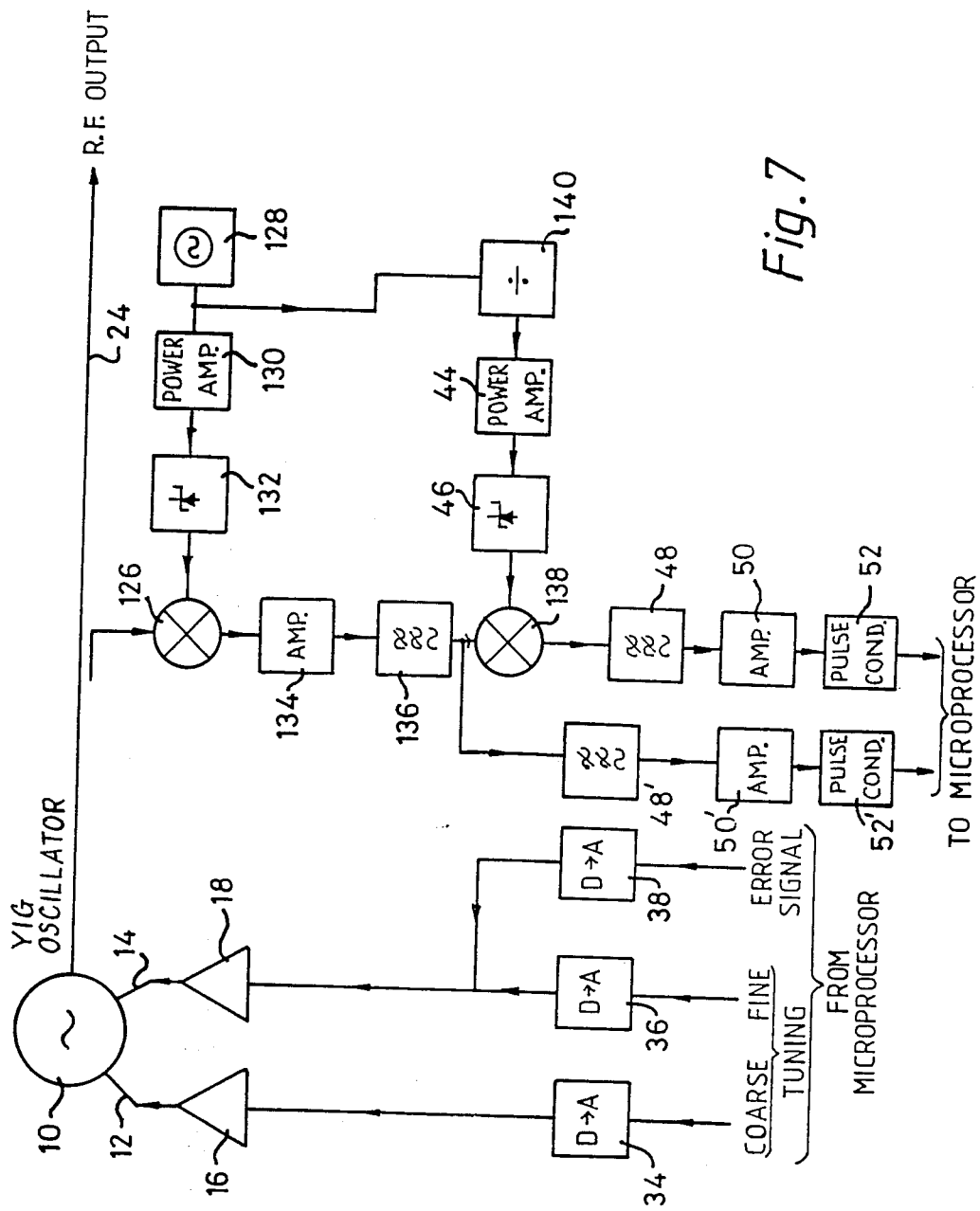
FIG. 7 shows a double down conversion system based on the circuit of FIG. 3, by which the RF range can reach as high as 30 GHz.

FIG. 7 represents a double down conversion system based on FIG. 3 but which will allow the software locking to reach 30 GHz and beyond by suitable choice of the two drive frequencies.

The design and operation of the system follows similar lines to FIG. 3, and similar reference numerals are employed where appropriate.

A sample of the RF output frequency is routed to a first down conversion stage comprising a sampler or mixer 126. To this sampler is applied a drive comb derived from a high frequency reference source 128 (eg a 500 MHz SAW oscillator), power amplifier 130 and a step recovery diode 132. The low frequency down conversion signal is then amplified and filtered by 134, 136 to provide a wideband drive signal to a second down conversion stage comprising a sampler or mixer 138 (corresponding to the sampler or mixer 40 of FIG. 3). This mixer 138 is driven with a drive signal having much lower frequency than that for the sampler or mixer 126. Conveniently the drive reference signal for 138 is obtained from a divided down signal from the first reference signal (i.e. the 500 MHz SAW source), by use of a divider 140.

The remainder of the circuit functions in general as described with reference to FIG. 3.

To allow for the greater non linearity and pointing inaccuracy that will occur at such high frequencies in the initial tuning of the output frequency, both the low frequency and the high frequency pulses are processed. To this end a second processing line 48', 50' & 52' is provided for the output of 136.

In use the YIG oscillator 10 is tuned approximately and the nearest relevent 500 MHz marker is searched for. Once found this can be referenced to the related 25 MHz marker on the low frequency marker output. From then on, for that frequency range, only reference to the 25 MHz markers is needed. Only if the output frequency is to be shifted by a large amount (eg greater than say 3 GHz) would reference back to the 500 MHz marker output be needed.

There now follows a listing and a general description of a programme which may be used in conjunction with a suitable microprocessor to perform the various frequency establishing steps and calibration steps of the apparatus herein described.

There now follows a listing and general description of a programme which may be used in conjunction with a suitable microprocessor to perform the various frequency establishing steps and calibration steps of the apparatus herein described.

Marker Locking Source Code

The one entry point is the procedure LOCK_START. This assumes that the sweeper has been set up to approximately the correct frequency and that only calibration to a 25.MHz marker is now required. It is assumed that the nearest marker will be the correct one for locking to. This implies that the maximum error in placing the frequency is less than 12.5 MHz.

Call lock start when the calling procedure is ready to start a sweep, the values for the NUDGE after lock must already have been calculated (in another module) from the required start frequency. In essence this is a simple algorithm to find the remainder after multiple subtraction of 25 MHz :-

REMAINDER = START- ([START / 25 MHz ] * 25 MHz)
IF REMAINDER $\geq$ 12.5 MHz then REMAINDER = REMAINDER - 25 MHz Where START is the required start frequency, "/" denotes integer division. REMAINDER is then scaled according to hardware to provide the value ERROR_ DAC_NUJ which is the value to be summed in to achieve the required start frequency after locking.

The structure of the module is as follows:-

LOCK START    Procedure

This is the main procedure, returning when calibration has been achieved, and the nudge has been added to achieve the required start frequency. This calls two main routines SEARCH_UP and SEARCH_DOWN.

SEARCH UP, SEARCH DOWN Procedures

These perform complete searches up and down (in frequency) looking for markers and locating their center points. The values corresponding to these points are stored in stores E1 and E2. These routines use primitive routines NUD, NDD.

NUD, NDD    Procedure

These routines are Nudge Up and Detect and Nudge Down and Detect. These set up the error_dac as requested and wait to search for a marker at the frequency generated. They include some intelligence to ensure that the reported status of marker present/not present takes into account the possible hole in the center of the marker.
These routines use WAIT_FOR_MARKER.

WAIT FOR MARKER    Procedure

This is a primitive routine which simply takes into account hardware delays after setting up the error_dac, and then tests for the presence of a marker at that one frequency point.

TEST TO 12M5

This routine simply returns a flag indicating if the found lock point is valid due to distance away from the uncalibrated point

Data used in this module

| | |
|---|---|
| error_lock | The final lock value |
| lock_errno | Error report from lock_start |
| error_dac_nuj | Nudge to required start frequency |
| locked_error_dac_data | Final stored data for error_dac |
| sweep_dac_start_adjust | Fine adjust of nudge |
| error_dac_default | Default value for locking |

| | |
|---|---|
| width_dac_data | Copy of data sent to sweep_width DAC. |
| current_sweep_data | Copy of current data sent to sweep sent to sweep_dac. |
| sweep_width | Actual width value required. |
| centre_dac_data | Copy of data sent to center_dac. |
| fm_nuj_down | Nudge value used when freq. < 12.5MHz (no marker at 0MHz) |
| max_distance | max distance allowed from default centre |
| gives_out | value when nujing start comes in |
| locked_error_dac_data | sum of_lock, and used _nuj |
| error_lock | data for error_dac after locking |
| error_dac_default | Estimated place to find mkr (DC or otherwise) |
| error_dac_nuj | NUJ up/down to get to start freq. from lock |
| lock_errno | finishing code from lock_start |
| e1 | stores for marker searching down |
| e2 | store for marker search up |
| marker_mask | bit mask for marker pack |

```
;****************************************************************
;Procedure WAIT_FOR_MARKER used by NUD.NDD looking for marker
;
;Enter with register DX holding data to go to error_dac
;Send this data to error_dac (driving FM coil)
;Allow to settle for period of time due to hardware driver delays
; and return NON-ZERO flag if mkr found, else ZERO flag
;****************************************************************
wait_for_marker:push    cx
                mov     ax,dx
                %outt(reset_marker,al)  ;Reset marker hardware
                %outt(error_dac,ax)     ;Set error dac driving FM coil
                mov     cx,delay50us    ;Wait for 50 us delay of
                                            error_dac
                loop    $               ; due to RC filtering.
                mov     cx,10           ;about 60us
wfm99:          %inn(al,marker_port)    ;Now start testing port
                and     al,marker_mask  ;
                loopz   wfm99           ;
                pop     cx              ;ZERO flag returns status of
                                            marker.
                ret
;****************************************************************
;Procedure       NUD (NDD)       Nudge Up (/Down) and Detect.
;
;Search routine detecting a marker by manipulating the error
                                            _dac Up(Down).
 Relies on WAIT_FOR_MARKER to return status of whether or not the
``` nudge to the DAC has placed the frequency within or outside a marker
;The algorithm is as follows :-
;1/. Increase DAC voltage, if overflow abort search and return error(CARRY).
;    Check for marker, if found return NON-ZERO.
;2/. Here with NOT MARKER FOUND, as this could be the hole in the
     middle of the marker, nudge out of hole and try again as '1/.'
;Whenever overflow occurs as a result of increasing the DAC, report
   the error.
;****************************************************************
;1/.
```
nud:    add     dx,dac_bit/4    ;nudge up and detect
        jc      nudex           ;end of travel of DAC
        call    wait_for_marker ;quickly check for markers
        jnz     nudx            ;marker found, OK
;2/.
        add     dx,2*dac_bit    ;else could be a hole, check for this
        jc      nudex           ;end of travel of DAC call    wait_for_marker ;try again having nudged over it, jnz     nudx            ;refound marker
;3/.
        pushf
        sub     dx,0
        popf
nudx:   ret
nudex:  or      lock_errno,1    ;out of range
        mov     dx,0ffffh
        stc                     ;indicate error
        ret
```
;****************************************************************
```
ndd:    sub     dx dac_bit/4    ;nudge down and detect
        jc      nddex           ;end of travel of DAC
        call    wait_for_marker ;quickly check for marker
        jnz     nddx            ;marker found ok
        sub     dx,2*dac_bit    ;else could be a hole, check for it
        jc      nddex           ;end of travel of DAC
        call    wait_for_marker ;try again having nudged over it,
                                ;if it was a hole
        jnz     nddx            ;refound marker
        pushf
        add     dx,0
```

```
            popf
nddx:   ret
nddex:  or      lock_errno,2    ;out of range
        mov     dx,0
        stc                     ;indicate error
        ret ;****************************************************************
;Procedure      search_up,(search_down).        Used in LOCK_START
;
;Complete search routine using NUD and NDD to manipulate error_dac
;and check for markers.
;Initialize error_dac to last known lock position and allow to settle.
;Then nudge up and down to find extremeties of marker and hence center
;Report center of found marker in store E1 for search_down.
;Report center of found marker in store E2 for search_up.
;****************************************************************
search_down:    mov     dx,error_lock   ;although should already be there
                mov     ax,dx
                %outt(error_dac,ax)
                mov     cx,delay1ms
                loop    $
sd0:    call    ndd             ;--start search downwards--
        jc      sdex            ; (end of range-error)
        jz      sd0             ;loop until found marker
sd1:    call    ndd             ;we are in a marker somewhere
        jc      sdex            ; (end of range-error)
        jnz     sd1             ;loop until marker is missing
        mov     e1,dx           ;save this position - one end of
                                 marker
sd2:    call    nud             ;found end of it
        jc      sdex            ; (end of range-error)
        jz      sd2             ;loop until found marker again
sd3:    call    nud             ;moved back in
        jc      sdex            ; (end of range-error)
        jnz     sd3             ;loop until marker is missing
sd4:    sub     dx,e1           ;found other end - gives width
        shr     dx,1            ;this is half width
sd5:    add     e1,dx           ;gives centre
        ret
sdex:   mov     e1,dx           ;error on search down, dx holds
                                ;overflow or underflow data
        ret
;****************************************************************
```

```
search_up       mov     dx error_lock
                mov     ax,dx
                %outt(error_dac,ax)
                mov     cx,delay1ms         ;v little delay here necessary
                loop    $
su0:            call    nud                 ;--Start Search Upwards--
                jc      suex                ;(end of range-error)
                jz      su0                 ;loop until marker found
su1:            call    nud                 ;we are in a marker somewhere
                jc      suex                ;(end of range-error)
                jnz     su1                 ;loop until marker is missing
                mov     e2,dx               ;this is far end of mkr,store temp
su2:            call    ndd                 ;now move back in jc      suex                ;(end of range-error)
                jz      su2                 ;loop until back into marker
su3:            call    ndd
                jc      suex                ;(end of range-error)
                jnz     su3                 ;loop until marker is missing
                mov     ax,e2               ;have now got other end
                sub     ax,dx               ;get width
                shr     ax,1
su4:            add     dx,ax               ;gives centre
su5:            mov     e2,dx
                ret
suex:           mov     dx,e1               ;get other lock-must be better
                jmp     su5
;****************************************************************
;Procedure      TEST_TO_12M5
;Register AX holds possible lock point.
;Procedure checks that it is within allowable error range.
;****************************************************************
test_to_12m5:   push    ax
                mov     bx,max_distance     ;test against 12.5 MHz shift
                sub     ax,error_dac_fault  ;where it should be calculated jnc     tt1
                neg     ax
tt1:            cmp     ax,bx
                pop     ax                  ;returns carry or below if
                                            ok
                ret

;****************************************************************
```

;lock_start  use error_lock to place the error coil at as good a
;guess as possible to where the expected marker is. This should
;always be (with 1 exception) the nearest marker. This will at the
;worst case be 12.5 MHz away from the required start frequency
;(assuming 25MHz markers). The exception is of course below 12.5MHz.
;Then perform routine to nudge (nuj) up and down the error dac to
;find the nearest marker(s). This final value will be the centre of
;the nearest marker.
;
;To actually get to the required start frequency, then, data is added
;which corresponds to the +/- 12.5MHz that the marker is away from
;START. This is in ERROR_DAC_NUJ. A -ve valve will move back below
;the marker, a +ve valve will jump forwards.
;
;To prevent the locking mechanism from locking to the wrong marker,
;some tests are done to check the distance the lock point is away.
;
;****************************************************************
```
lock_start:     mov     lock_errno,0
                call    search_down             ;search downwards
                call    search_up               ;and search upwards, store
                                                 in e2
                mov     ax,e2                   ;search_up lock point
                mov     dx,el                   ;search_down lock point
                cmp     lock_errno,0            ;check any error reported
;Failed to lock, test the 2 attempts preferred is in AX (it needn't be
though)
                je      both_ok
                cmp     dx,0                    ;search down point
                je      ls1
                cmp     dx,0ffffh               ;search down point
                je      ls1
                xchg    ax,dx                   ;so make search down 1st
                                                 choice
                jmp     ls1
;Found the mkr on both attempts, or found two - which is best ?
both_ok:        cmp     ax,dx                   ;compare with other lock
                                                 point "el"
                jae     ls3                     ;swop so that the 2
                                                 attempts are such that
                xchg    ax,dx                   ;ax ≥ dx
ls3:            mov     cx,ax                   ;save the higher value
                sub     ax,dx                   ;difference between the two
                shr     ax,1
```

```
                add     ax,dx                   ;to find centre of 2 found
                                                 markers
                cmp     ax,error_lock
                mov     ax,cx                   ;get the other marker back
                                                 to ax
                jbe     ls1                     ;test this (ax) out and see
                                                 if OK
                xchg    ax,dx
;here with preferred mkr in ax, other in dx
ls1:            call    test_to_12m5
                jb      thisok
                mov     ax,dx                   ;try other one
                call    test_to_12m5
                jb      thisok                  ;this one is better
                mov     lock_errno,20h
                mov     ax,sweep_dac_start      ;error placing centre
                                                 reduced
                mov     error_lock,8000h        ;centre of range
                jmp     ex1                     ;don't waste time locking if
                                                 rf not on
;Enter with ax as new locking data
thisok          mov     bx,ax                   ;compare with last lock
                                                 attempt
                sub     bx,error_lock
                jnc     nn3
                neg     bx
nn3:
just_set_error_lock:
                mov     error_lock,ax
                mov     sweep_dac_start_adjust,0
nuj_sweep_start:
;all lock attempts must fall through here to tidy up
;
ex1:            mov     ax,error_lock
                cmp     ax,0                    ;avoid all 'end of travel'
                                                 values
                jne     el1
                mov     ax,8000h
el1:            cmp     ax,0ffffh
                jne     el2
                mov     ax,8000h
el2:            mov     error_lock,ax
                add     ax,error_dac_nuj        ;either nuj from lock point
                                                ;or from calculated centre
                                                 dac position
```

```
        sub     ax,fm_nuj_down      ;for low frequencies mov     locked_error_dac_data,ax
        mov     error_sweep_data,ax
;this is where a sweep on error dac would start (for resolution)
;problems on width
lkex:           %outt(error_dac,ax)
ls7:            ret                 ;return having locked up
end (marker module)
```

We claim:

1. A method of setting up a signal generating device to deliver an output frequency of F MHz which may lie anywhere in a range extending up to hundreds and thousands of MHz, and which includes the input of coarse and fine frequency controlling signals, wherein the fine frequency controlling signal is capable of producing linear changes in output frequency for corresponding changes in the parameter of an electric signal supplied thereto, but only over a small range of N MHz, according to which:

the output of the device is combined with a multi-component reference signal containing at least a component having a frequency of L MHz, which is within N MHz of the desired frequency F MHz, the frequency controlling signals supplied to the device are adjusted to yield an output signal having a frequency also within N MHz of F MHz, the frequency of the fine frequency controlling signal is then adjusted until a correspondence signal is detected and indicates a one to one relationship of the output signal and the said component of the reference signal, the values of the frequency controlling signals at which a correspondence signal is detected are stored, using at least one of an algorithm and look-up table the value of a correcting signal requried for the fine frequency control to shift the frequency of the device by (F−L) MHz is determined and the desired output signal of F MHz is obtained by adding the correcting signal to the stored signals and using the combined signal as the control signal for the device.

2. A method according to claim 1, wherein the frequency adjustment of the fine frequency controlling signal, correspondence signal detection, storing of the values of the fine frequency controlling signals and the adding of the correcting signal to the stored signals is effected under the control of a microprocessor.

3. A signal generating device whose output frequency is to be set at a frequency F, comprising:

(1) a master oscillator having an output at which a radio frequency signal appears when the oscillator is operating and having, in addition to a large bandwidth frequency controlling element, a small bandwidth controlling element by which changes in the frequency of oscillation over a small band of frequencies can be obtained by making linear changes in a parameter of an electrical signal supplied thereto, (2) a control system adapted to generate, from information entered therein, electrical signals for controlling the frequency of the master oscillator, (3) means for deriving a sample signal from the output of the master oscillator, (4) a stable fixed frequency oscillator signal source for producing a reference signal F(ref), (5) circuit means for producing from the reference signal F(ref) a harmonic spectrum ("comb") signal of signals F(ref); 2F(ref); 3F(ref); ... n.F(ref), at least one component of which is within the said small band of frequencies from F, (6) mixing circuit means for combining the sample signal with the harmonic spectrum signal to produce beat signals, i.e. signals having frequencies which are inter alia the arithmetic difference between the frequency of the sample signal and the component in the said harmonic spectrum signal, and (7) beat signal detector circuit means responsive to the output of the mixing circuit means and adapted to identify when a beat signal is occurring:

wherein for the purpose of frequency calibration the control system is programmed to alter the frequency determining signals supplied to the master oscillator until a selected beat signal is detected (caused by the interaction of the master oscillator output signal and a component N.F(ref) of the harmonic spectrum signal) at which point the values of the frequency determining signals supplied to te master oscillator are employed in the computation of new values for the control signals for the master oscillator to give a frequency of oscillation equal to (N.F.(ref)+X), where X is the frequency shift required between N.F(ref) and the desired frequency F.

4. A signal generator according to claim 3, wherein a frequency selector including a low pass filter is to select the beat signal of interest from the arithmetic difference signals.

5. A signal generating device according to claim 3, wherein the controlling elements each have an input, and the control system is adapted to produce a first control signal for the first input and a second control signal for the second input.

6. A signal generating device according to claim 3, wherein the master oscillator is a YIG oscillator having a main tuning coil for wide range tuning and a smaller FM coil for fine range tuning, respectively constituting the said two frequency controlling elements.

7. A signal generating device according to claim 3, wherein the master oscillator is a varactor tuned oscillator.

8. A method of controlling the frequency of oscillation of a master oscillator in a signal generator in which a linear frequency controlling element has a restricted frequency sweep capability comprising the steps of:

(1) generating frequency control signals which when applied to the frequency controlling element will theoretically produce a frequency F in the output of the master oscillator, (2) sampling the master oscillator output signal and combining the sample of the master oscillator output signal with a reference signal having a component within the said restricted frequency sweep of the master oscillator, (3) adjusting the values of the frequency control signals until a selected beat signal is detected between the master oscillator output signal and the reference signal component, and (4) thereafter adjusting the values of the frequency control signals from the values corresponding to the selected beat signal to new values computed using at least one of an algorithm and look-up table describing the frequency response of the master oscillator to the values of the frequency control signals therefor, thereby to shift the master oscillator output to the desired frequency, wherein digital signals are generated by a microprocessor and digital to analogue convertor means serve to convert the digital signals to signal levels which are used as the frequency controlling signals for the master oscillator.

9. A method according to claim 8, wherein, for causing the master oscillator to sweep through a range of frequencies, the steps include:

(a) varying the computed control signal using the adjusted control signal as a starting point, the variation being in accordance with an algorithm linking the frequency of oscillation with value of the control signal, (b) when the final target frequency of the sweep has been reached, thereafter inibiting the output of the master oscillator, and (c) thereafter repeating steps (a) and (b) until a beat signal is again detected, whereafter the sweep through a range of frequencies is again initiated.

10. A method according to claim 9, wherein the reference signal is an harmonic spectrum signal.

11. A method according to claim 9, including the steps of:

(A) identifying a series of key frequencies throughout the range which is to be swept and starting with one of the lowest or the highest, making corrections to the control signal supplied to the master oscillator until the selected beat signal is produced by the interaction of the master oscillator output signal and a component of the reference signal, (B) modifying the corrected control signal in accordance with the algorithm to produce a control signal for obtaining frequencies in between a first frequency and a succeeding target frequency, (C) when the succeeding target frequency is approached, repeating step (A) for the oscillator control signal before continuing to alter the frequency of the oscillator through the next range of frequencies to the next target frequency.

12. A method according to claim 8, according to which the beat signal is selected by means of a low pass filter receiving detected beat signals and set to transmit signals in the range d.c. to f, where f typically lies in the range 500 kHz to 5 MHz, and signal amplifying and pulse conditioning circuit means is provided after the low pass filter and before the microprocessor.

13. A method according to claim 8, wherein the start of the range to be swept is found by the steps of:

(1) from a selected width to be swept and the centre of the selected swept range information the microprocessor is programmed to compute a control signal so that the digital to analogue converter means is initialised by the micro-processor and produces at least one analogue signal which should theoretically cause the master oscillator to generate the start frequency, (2) simultaneously an error DAC is set to mid-range, (3) a correction in an error signal is then produced by the microprocessor so as to alter the output from the error DAC until a beat signal is detected, (4) the total correction to the value of the error signal required to produce a selected beat signal pulse is stored in a buffer memory for subsequent reference, (5) an adjustment in the control signals supplied to the master oscillator is effected according to a frequency/control signal characteristic of the master oscillator, using the stored values in the buffer as a starting point, to obtain a new frequency of operation of the master oscillator corresponding to the start frequency (f1) of the sweep, (6) a sweep is effected by the microprocessor producing a varying output signal which serves as the frequency controlling signal of the master oscillator so as to prooduce the desired sweep in the output frequency thereof from f1 to f2.

14. A method according to claim 13 including the step of determining from the width of the beat signal pulse a precise mid-position of the selected beat signal pulse, which corresponds to the null frequency or DC content within the beat signal, the microprocessor being programmed to seek out the mid-position of any beat signal pulse detected thereby and to use the determined mid-position of the pulse as the target.

15. A method according to claim 14 according to which for operation in the sweep mode, i.e. where the generator produces a signal whose frequency varies with time from a first frequency (F1') to a second frequency (F2) defining a swept band, two items of information are entered into a memory associated with the microprocessor namely:

(1) the sweep width (i.e. F2−F1), and
(2) the centre of the swept range (i.e. $\frac{1}{2}$(F2+F1).

16. A method according to claim 15 wherein, at the end of each sweep, the microprocessor reverse to a search routine to locate the beat signal.

* * * * *